(12) United States Patent
Patterson

(10) Patent No.: US 7,924,096 B2
(45) Date of Patent: Apr. 12, 2011

(54) INPUT BUFFER WITH IMPEDANCE CANCELLATION

(75) Inventor: Gregory Patterson, High Point, NC (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 12/507,534

(22) Filed: Jul. 22, 2009

(65) Prior Publication Data

US 2010/0225395 A1 Sep. 9, 2010

Related U.S. Application Data

(60) Provisional application No. 61/158,049, filed on Mar. 6, 2009.

(51) Int. Cl.
*H03F 3/45* (2006.01)

(52) U.S. Cl. .................. 330/259; 330/257; 330/258

(58) Field of Classification Search .......... 330/259, 330/257, 258
See application file for complete search history.

(56) References Cited

U.S. PATENT DOCUMENTS

| | | | |
|---|---|---|---|
| 4,969,195 A | 11/1990 | Noro | |
| 5,631,598 A | 5/1997 | Miranda et al. | |
| 6,501,449 B1 * | 12/2002 | Huang | 345/82 |
| 6,650,195 B1 * | 11/2003 | Brunn et al. | 331/177 V |
| 6,798,273 B2 * | 9/2004 | Le | 327/530 |
| 7,332,966 B2 * | 2/2008 | Furuya et al. | 330/289 |
| 7,548,094 B2 * | 6/2009 | Shepard et al. | 326/82 |
| 7,821,324 B2 * | 10/2010 | Han | 327/535 |

OTHER PUBLICATIONS

Maximim Integrated Products, "Negative Resistor Cancels Op Amp Load", Application Note 1868, Jan. 31, 2003.
Maxim Integrated Products, "Negative-Resistance Load Canceller Allows Voltage Reference to Drive Heavy Loads", Application Note 815, Sep. 26, 2001.
Wikipedia, "Negative Impedance Converter", retrieved from http://en.wikipedia.org/wiki/Negative_impedance_converter, entry last modified on Apr. 12, 2008.

* cited by examiner

*Primary Examiner* — Patricia Nguyen
(74) *Attorney, Agent, or Firm* — Kenyon & Kenyon LLP

(57) ABSTRACT

An exemplary negative impedance converting circuit for functioning as a voltage buffer and/or negating the impedance of a connected load. The negative impedance converting circuit includes inputs, outputs, a first transconductance stage and a second transconductance stage. The transconductance gain value of the first transconductance stage is greater than a transconductance gain value of the second transconductance stage. Exemplary embodiments of a reference voltage buffer using the negative impedance converting circuit are also described.

18 Claims, 8 Drawing Sheets

INPUT BUFFER WITH IMPEDANCE CANCELLATION

This application benefits from the priority of U.S. Provisional Patent Application Ser. No. 61/158,049, filed Mar. 6, 2009, the entire disclosure of which is incorporated herein by reference.

BACKGROUND

Embodiments of the present invention are directed to an input voltage buffer for providing an input voltage to circuit components such as an analog-digital converter (ADC). Typically, an emitter follower-type of circuit is used as the input voltage buffer, and the output voltage at the emitter is sampled. When used in differential AC-coupled applications, it may be necessary to provide an input common-mode bias.

Often, the input bias is applied through a common-mode reference buffer, as shown in the input buffer 100 of FIG. 1. In FIG. 1, the common-mode reference, $V_{CM}$ 110 is applied to the input buffer 100 through a common-mode buffer 120 and two equal resistors $R_{CM}$ 130.1, 130.2. If it is desired to set the output bias voltage Vout of the input buffer equal to $V_{CM}$, the common-mode reference buffer must level shift the reference. As shown in FIG. 1, this level shift compensates for the base-emitter voltage ($V_{BE}$) of the input device, such as transistors 150.1, 150.2 and the voltage drop due to base current flow, which is equal to $I_{AVG}$, across the common-mode resistors $R_{CM}$ 130.1, 130.2. This level shift can be created accurately based on knowledge of the input device, the input device's base current, and the common-mode resistor $R_{CM}$. A circuit can be made that accurately creates a level shift with a replica (or properly scaled replica) of the input devices 150.1, 150.2 and the common-mode input resistance $R_{CM}$ 130.1, 130.2.

In a sampled data system, such as an ADC, there is a phase of the sample clock (hold phase) during which the input is not applied to the sampling network. In an effort to save power, the input signal buffer may be switched off during this phase. The input buffer is re-activated in the sample phase. The input buffer must recover sufficiently in the sample phase to avoid error in the sampled voltage.

Considering the input common-mode bias structure of FIG. 1, switching by switches 160.1, 160.2 of the input buffer can, however, cause a common-mode bias error even when allowing a sufficient recovery time for the signal buffer. The voltage $V_{CM}$ 110 is a common mode voltage that maintains a stable voltage value. A common-mode buffer 120 provides a buffered and level-shifted reference voltage. The base current of the switched input buffer device is filtered by the relatively large AC-coupling capacitors 140.1, 140.2 to produce a current approximately equal to the average of the switched current, $I_{avg}$. The flow of this average current across $R_{CM}$ 130 produces a possible error that must be cancelled with an appropriate level shift.

The true average of the current $I_B$ cannot easily be determined, and ringing, undershoot and overshoot cause errors in the estimated value of $I_{avg}$. Attempts have been made to approximate the average current $I_{avg}$ by scaling a base current to a replica to account for the averaging. However, the switched base current $I_B$ does not have a perfect 50% duty cycle square wave but has some ringing, overshoot, undershoot, and/or other imperfections associated with the transitions. Accordingly, it is difficult to replicate the average current $I_{avg}$ exactly to correct for the above described imperfections to prevent the error in common-mode bias voltage.

In more detail, the voltage at the base of transistors 150.1, 150.2 should be $V_{CM}+V_{BE}$; however, due to the unknown average of the current $I_B$ over the common mode resistance $R_{CM}$ 130.1, 130.2, the voltage at the base of transistor 150.1, 150.2 is $V_{cm}+V_{be}-\Delta I_{avg}R_{cm}$. Here, $\Delta$Iavg, which is the difference between the actual $I_{avg}$ and the estimate of $I_{avg}$ ($I_{avg}$ (est)), is being used to generate the output voltage of the common-mode buffer, which is equal to $V_{cm}+V_{be}+I_{avg}$(est) $R_{cm}$. In which case, the voltage $I_{avg}R_{cm}$ is not accurately known, thereby causing error in the common mode. The current sources 170.1, 170.2 represent a combined current $I_B+I_C$.

Previous attempts to replicate an estimate of the unknown current fail to accurately solve the problem of base-current-created common-mode voltage error with a switched input buffer. Since the detrimental effects of the unknown current would not easily be negated by replicating an estimate of the unknown current, a different solution was needed.

The inventor recognized that if the common-mode resistors could be negated, replicating the unknown current would not be necessary. One way to accomplish this is to generate a "negative" impedance. Placing an appropriately valued negative impedance in series with the output of the common-mode buffer would effectively cancel the common-mode resistors. This effect could be achieved with a common-mode buffer with negative output impedance. Negative impedance converters are known. However, the widely known prior art negative impedance converter is typically used as a shunt load impedance, not as a voltage buffer. It would be beneficial to have a negative impedance converter configured for use as a voltage buffer.

DETAILED DESCRIPTION

Figure 1:
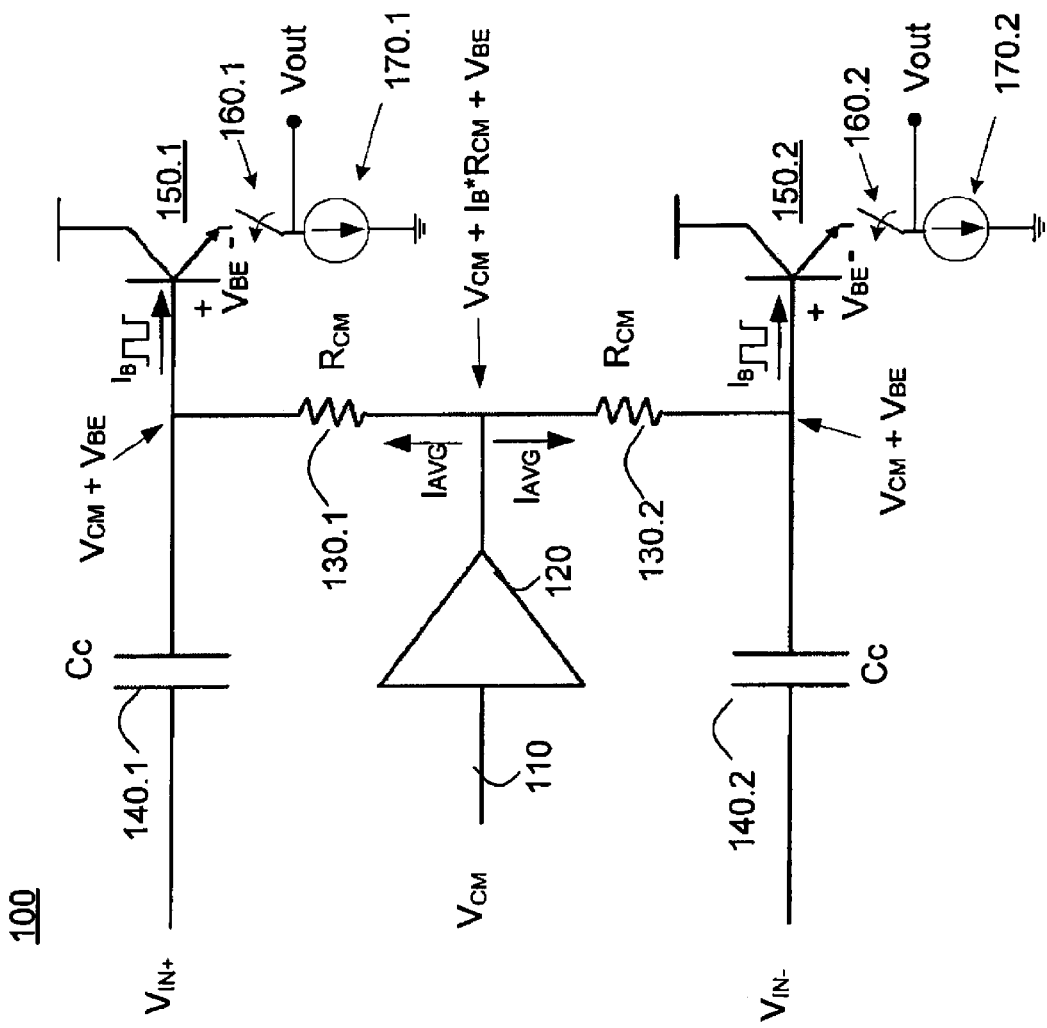
FIG. 1 is a schematic diagram of an input buffer switching circuit.

Embodiments of the present invention provide a reference buffer with "negative" output impedance. The buffer may include a voltage amplifier, a current mirror, transistors, an offset resistor, a first feedback path and a second feedback path. The voltage amplifier has an output connected to a gate terminal of a first transistor and a second transistor. The current mirror has connection points, one connection point is connected to a drain of the first transistor and another connection point is connected to a drain of the second transistor. The first transistor has a larger width-to-channel length (W/L) ratio than the second transistor. The offset resistor is connected between the drain of the first transistor and the respective connection point of the first transistor to the current mirror. The first feedback path to the voltage amplifier includes the first transistor and the offset resistor, while the second feedback path to the voltage amplifier includes the second transistor and the current mirror.

Embodiments of the present invention provide a voltage reference buffer that can have a first feedback path to the voltage amplifier connected to a non-inverting input of the voltage amplifier and a terminal of the offset resistor. The first feedback path can be traced from the output of the voltage amplifier through the first transistor, the offset resistor to the non-inverting input of the voltage amplifier. A second feedback path to the voltage amplifier can be traced along a path from the output of the voltage amplifier through the second transistor, a current mirror and to the non-inverting input of the voltage amplifier. An output is connected at the drain of the first transistor.

An input voltage network may have a differential input voltage applied to a first input and a second input, a common-mode reference voltage applied to a third input, a first and second impedance, a first transistor and a second transistor, and an amplifier circuit. The first transistor and the second transistor may each have a base, emitter, and collector. The amplifier circuit may be configured to appear as a negative resistance to circuit components connected thereto. The amplifier may include an input and a first output. The input being the third input into the circuit, and the first output connected to both the first impedance and the second impedance. The first impedance and the first input are connected to the base of the first transistor and the second impedance and the second input to the second transistor.

Embodiments of the present invention can provide a negative impedance converter, including a voltage amplifier, a first transconductance stage, a second transconductance stage, and an output. The voltage amplifier can have an input voltage source connected to an inverting input, or first input, of the voltage amplifier and a second terminal of an impedance connected to the non-inverting input, or second input, of the voltage amplifier. The first transconductance stage can have a first input connected to the output of the voltage amplifier, a second input connected to a signal ground, and an output connected to a first terminal of an impedance, the first transconductance stage can have a transconductance value equal to approximately a first transconductance value. The second transconductance stage can have a first input connected to the output of the voltage amplifier and a second input connected to the signal ground, and an output connected to a second terminal of the impedance, the transconductance of the second transconductance stage can be equal to approximately a second transconductance value, wherein the first transconductance value is N times greater than the second transconductance value, wherein N is the transconductance gain of the first transconductance stage compared to the second transconductance stage. The output connected to the first terminal of the impedance for providing an output voltage signal based on the input voltage from the input voltage source.

Figure 2:
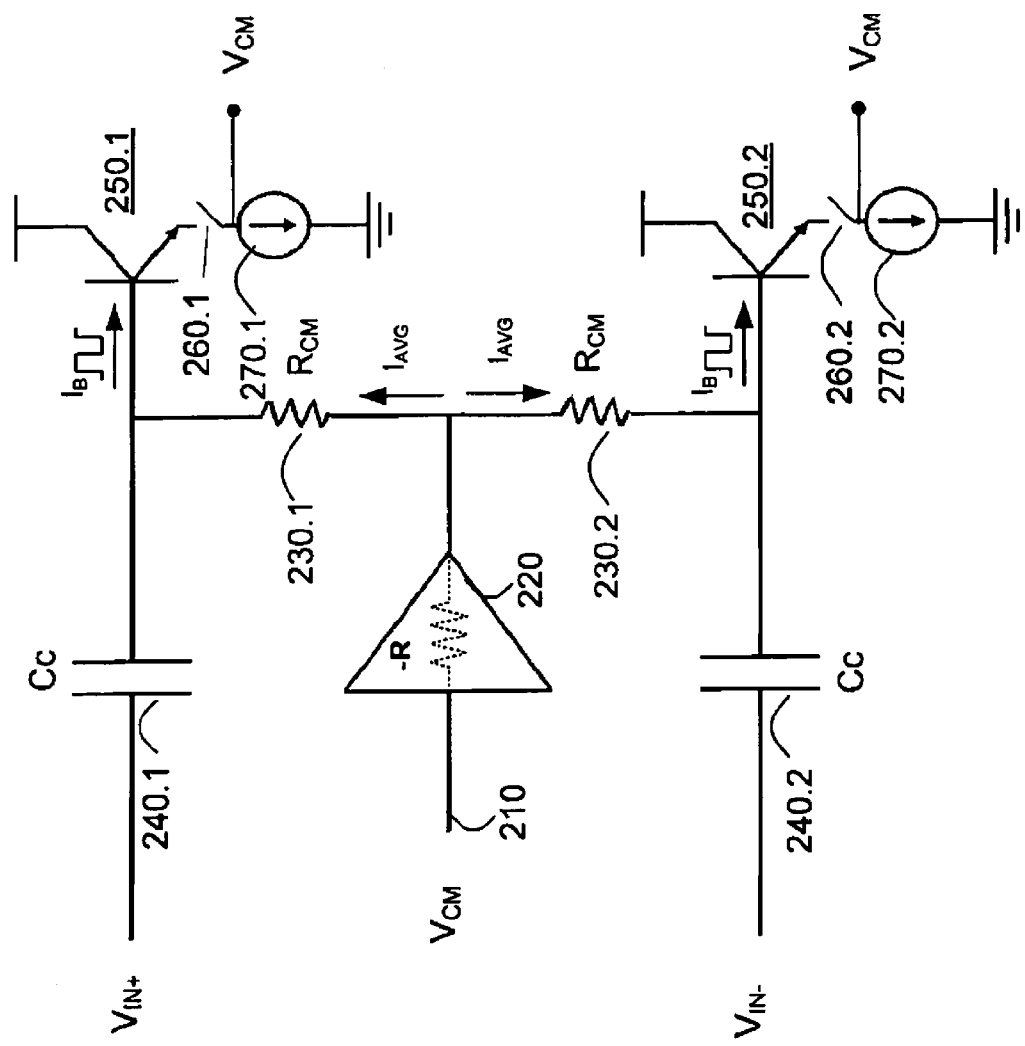
FIG. 2 is a schematic diagram of an input buffer switching circuit according to an exemplary embodiment of the present invention.

FIG. 2 illustrates a differential implementation of a common-mode reference buffer according to an exemplary embodiment of the present invention. The differential input signal voltages $V_{IN+}$ and $V_{IN-}$ are applied to the inputs of AC-coupling capacitors $C_c$ 240.1 and $C_c$ 240.2, respectively. In addition, a common-mode reference voltage $V_{CM}$ is applied to buffer input 210. The buffer input 210 is an input into amplifier circuit 220. The amplifier circuit 220 is configured to provide an effective "negative" output resistance (−R) that offsets the voltage resulting from the average current $I_{AVG}$ through the common mode voltage resistors $R_{CM}$ 230.1 and 230.2. The configuration of the amplifier circuit 220 by appearing as an effective negative resistance cancels the voltage drop, due to current $I_{avg}$ across the common-mode resistors that adversely affects the voltage that appears at the node after switches 260.1 and 260.2. The current sources 270.1, 270.2 represent a combined current $I_B+I_C$.

Figure 3A:
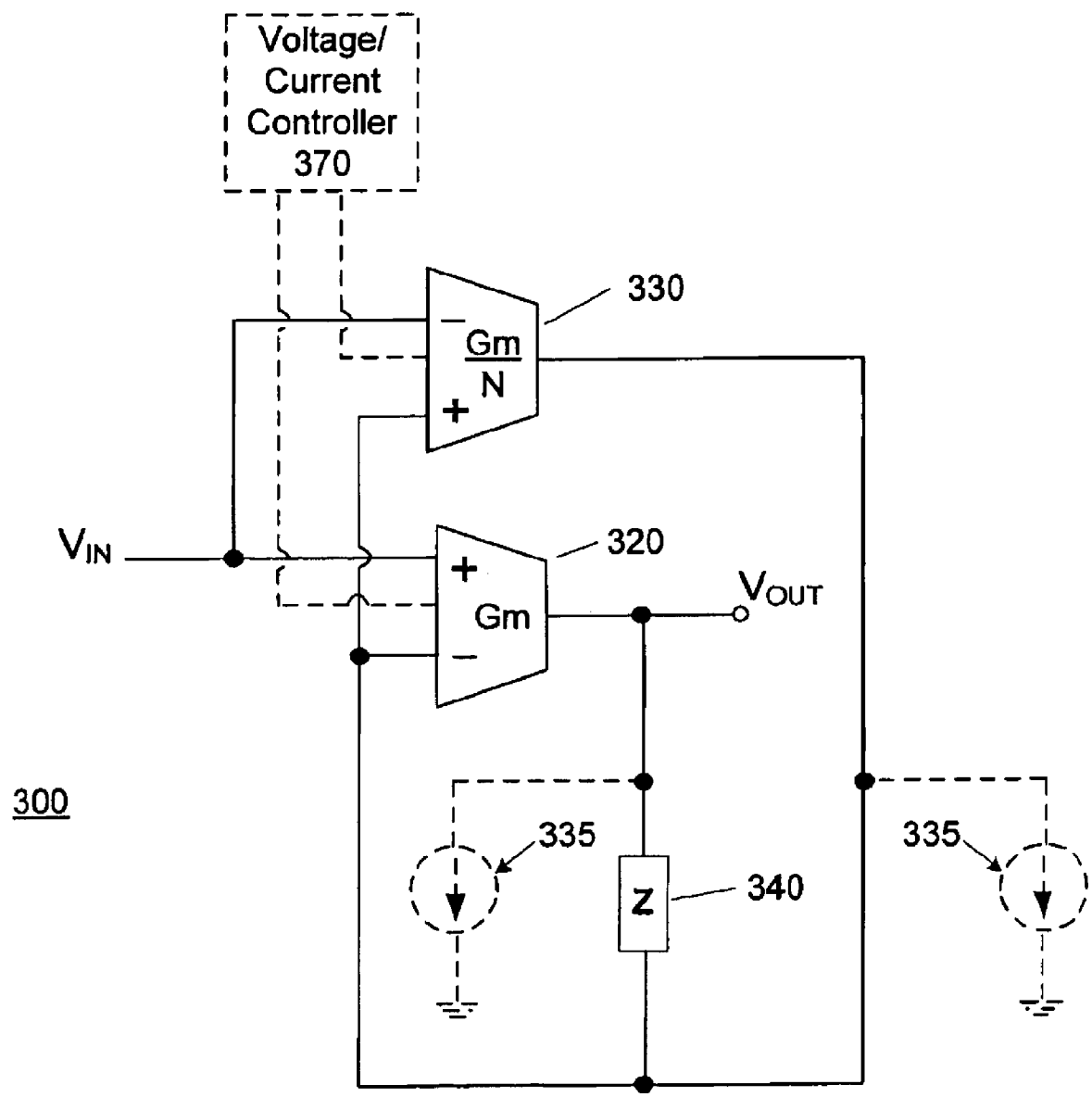
FIGS. 3A and 3B illustrate a negative impedance converter according to exemplary embodiments of the present invention.

FIG. 3A illustrates an exemplary embodiment of a circuit that provides a "negative" output impedance. The negative impedance converter circuit 300 includes an input for an input signal $V_{IN}$, a first transconductance stage 320, a second transconductance stage 330 and an impedance 340. In addition, a bias current source 335 can optionally be added, for example, at the locations shown in the figure, to maintain the transconductance stages at a certain bias point. A resistor is an example of a bias current source 335. It should be noted that such a bias current source will generate an offset voltage due to its current flowing across the impedance 340. This error offset voltage can be accounted for by adjusting the input signal $V_{IN}$ with an additional, corresponding offset voltage.

The first transconductance stage 320 can be configured to have a transconductance Gm that is N times larger than the second transconductance 330, in which case the second transconductance stage can have a transconductance of Gm/N. The divisor N can be created by using in the first transconductance stage 320 transistors having a first predetermined width/length, and using in the second transconductance stage 330 transistors that have a second width/length, such that the ratio of the width/length of transistors in the first transconductance stage 320 to width/length of transistors in the second transconductance stage 330 is N times larger, i.e., N:1.

The impedance 340 can have a first terminal and a second terminal, and can be selected based on the load impedance that is to be canceled or negated. The impedance 340 can be a variable impedance represented by the value Z. The impedance 340 can be varied, for example, by using switches with additional impedance elements configured in series or parallel.

Optionally, either of the transconductance stages 320 or 330 may be tuned relative to the other to tune their ratio of transconductance, N, and thereby tune the effective output impedance [which approximately equals −Z/(N−1)]. With transconductance stages 320 and 330 each being a general transconductance gain stage, their transconductance may be tuned in a variety of methods by using bias current, bias voltage, or switched elements, either individually or in combination. Controller 370 can, for example, provide a voltage signal to vary the resistance of a device operating in the triode region, or provide a current signal to bias the current generated in the respective transconductance stage(s). Controller 370 can be one controller or be a number of controllers specific to each transconductance stage 320 and 330. Additional methods and circuits for tuning transconductance are known, and may be incorporated to tune the transconductance stages 320 and/or 330. The operation of the negative impedance converter circuit 300 will be described with reference to FIG. 4.

Figure 3B:
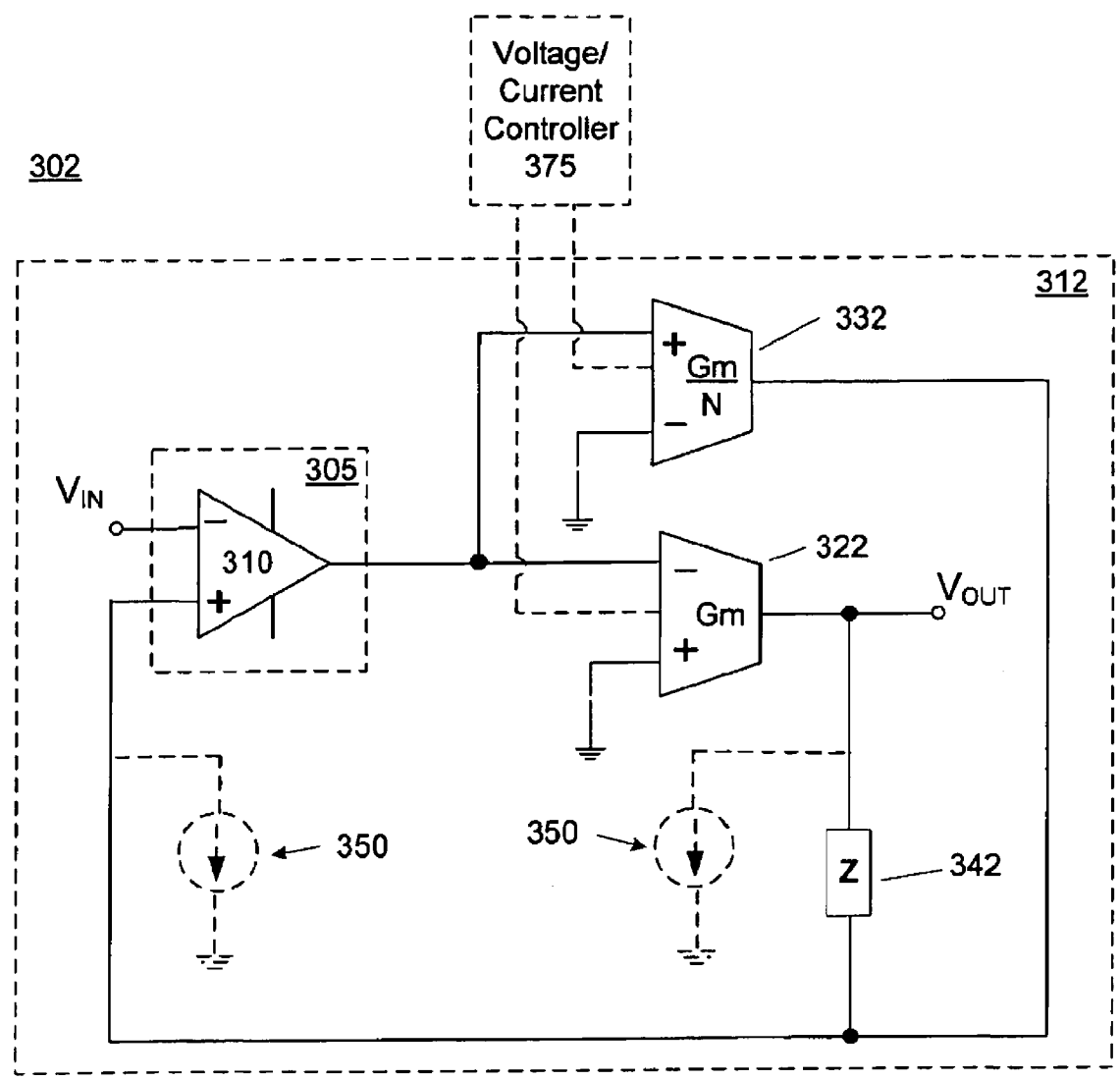

FIG. 3B illustrates an alternative embodiment. The negative impedance circuit 302 includes a negative impedance stage 312 with a gain stage 305. The gain stage 305 can include an input buffer 310, such as a voltage amplifier. The negative impedance stage 312 can be configured to include a first transconductance stage 322, a second transconductance stage 332 and an impedance 342. In addition, a bias current source 350 can optionally be added, for example, at the locations shown in the figure, to maintain the transconductance stages at a certain bias point. The bias current source 350 can be any type of current source such as a resistor. It should be noted that such a bias current source will generate an offset voltage due to its current flowing across the impedance 342. This error offset voltage can be accounted for by adjusting the input signal $V_{IN}$ with a corresponding offset voltage.

The impedance 342 can have a first terminal and a second terminal, and can be selected based on the load impedance that is to be canceled or negated. The impedance 342 can be a variable impedance represented by the value Z. The impedance 342 can be varied, for example, by using switches with additional impedance elements configured in series or parallel.

The first transconductance stage 322 can be configured to have a transconductance Gm that is N times larger than the second transconductance 332, in which case the second transconductance stage can have a transconductance of Gm/N. The divisor N can be created by using in the first transconductance stage 322 transistors having a first predetermined width/length and in the second transconductance stage 330 transistors that have a second width/length, such that the ratio of the width/length of transistors in the first transconductance stage 322 to width/length of transistors in the second transconductance stage 332 is N times larger. Optionally, either of the transconductance stages 322 or 332 may be tuned relative to the other to tune their ratio of transconductances, N, and thereby tune the effective output impedance [which=$-Z/(N-1)$]. With transconductance stages 322 or 332 each being a general transconductance gain stage, their transconductance may be tuned in a variety of methods (including bias current, bias voltage, or switched elements). Controller 375 can, for example, provide a voltage signal to vary the resistance of a device operating in the triode region to change the transconductance value, or provide a current signal to bias the current generated in the transconductance stage. Controller 375 can be one controller or be a number of controllers specific to each transconductance stage 322 and 332. Additional methods and circuits for tuning transconductance are known and may be incorporated into the transconductance stages 322 and/or 332.

Of course, different configurations than those shown in FIGS. 3A and 3B can be envisioned. For example, in the circuit of FIG. 3B, the input terminal polarities of amplifier 310 could be reversed, and if polarities of the inputs to transconductance stages 322 and 332 are also reversed, the overall feedback polarity remains correct.

Figure 4:
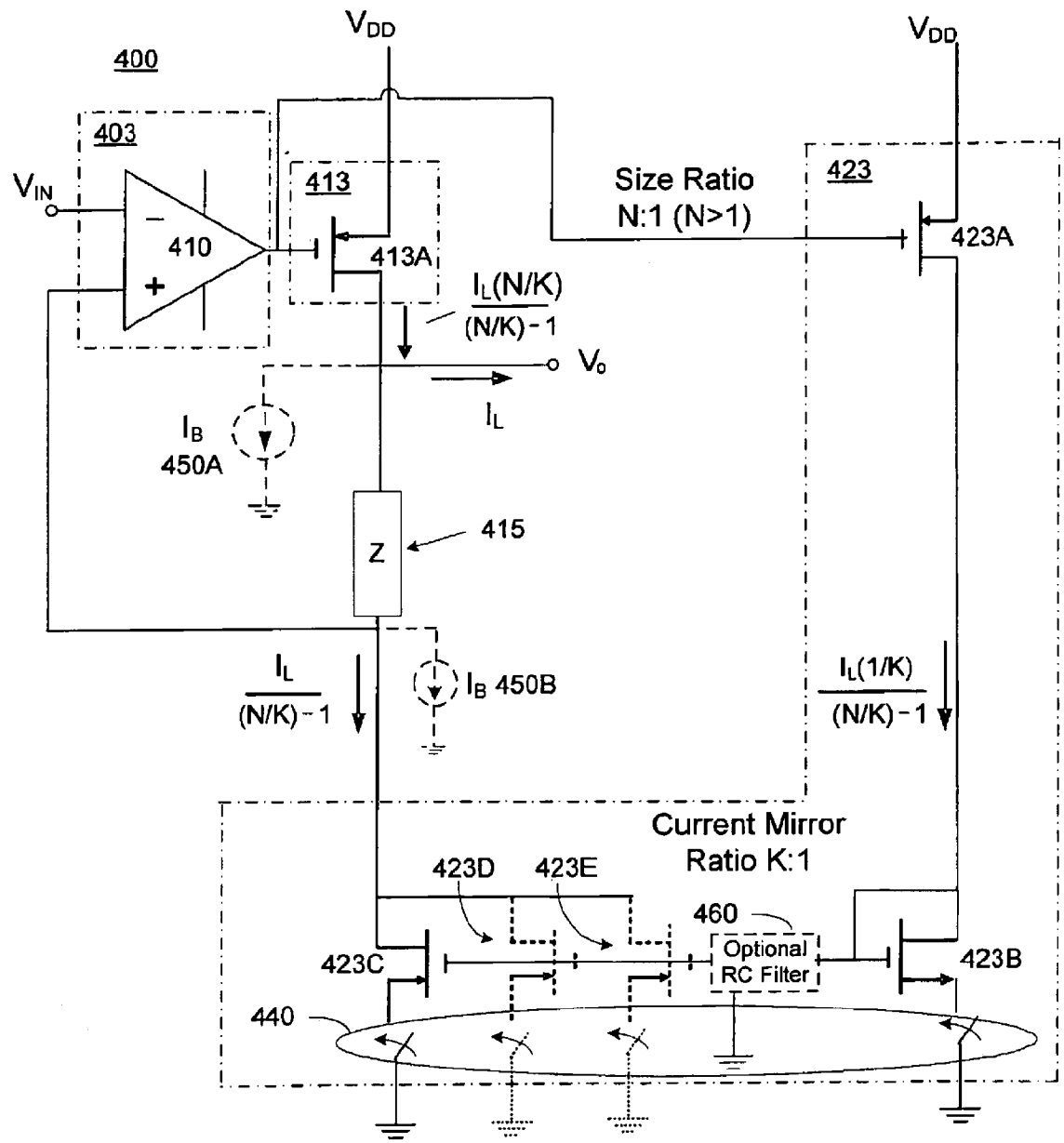
FIG. 4 is a schematic diagram of an implementation of a negative impedance converter according to an exemplary embodiment of the present invention.

FIG. 4 illustrates a schematic diagram of an exemplary implementation of a circuit according to an embodiment of the present invention. The negative impedance converter circuit 400 can include an input, a gain stage 403, a first transconductance stage 413, an impedance 415, and a second transconductance stage 423.

The gain stage 403 has inputs for at least an input signal and a feedback signal, and an output. The gain stage 403 can include a voltage amplifier 410, which as shown has an inverting input, a non-inverting input and an output. The inverting input to the voltage amplifier 410 receives an input voltage signal $V_{IN}$ as an input to the gain stage 403. The non-inverting input of the voltage amplifier 410 is connected to a second terminal of the impedance 415. The output of the gain stage 403 of the voltage amplifier 410 outputs a signal that is the amplified difference between feedback input voltage at the non-inverting input of the voltage amplifier 410 and the input voltage signal $V_{IN}$. Although shown implemented using a voltage amplifier 410, the gain stage 403 can be implemented using various configurations of amplifiers and circuit components to provide the same output.

The first transconductance stage 413 can have inputs and outputs. A first input is from gain stage 403 and is the output of the voltage amplifier 410, a second input can be the voltage supply $V_{DD}$, and a first output can provide current to impedance 415. The first transconductance stage 413 can be implemented using a PMOS transistor 413A, the gate of which is connected to the output of the voltage amplifier 410, the source of which is connected to voltage $V_{DD}$, and the drain (i.e., output) of which is connected to a first terminal of the impedance 415. The current out of the first transconductance stage 413 can be approximately equal to $I_L(N/K)/[(N/K)-1]$. The PMOS transistor 413A can have a first W/L ratio.

The value Z of the impedance 415 can be set to be approximately equal to the impedance of the load to which the output voltage Vo is connected multiplied by $[(N/K)-1]$. The output impedance of 400 at Vo is equal to $-Z/[(N/K)-1]$.

The second transconductance stage 423 can also have inputs and outputs. A first input is from the output of the voltage amplifier 410, a second input can be the voltage supply $V_{DD}$, a first output can be to a second terminal of the impedance 415, and a third input can be to ground. The second transconductance stage 423 can include a number of PMOS transistors, or any other type of transistors, or other forms of transconductors. PMOS transistors will be described for ease of explanation. Second transconductance stage 423 can have as its first input, a first PMOS transistor 423A connected at its gate to the output of the voltage amplifier 410, which is also the input of the first transconductance stage 413. In addition, the size (W/L) ratio of first PMOS transistor 413 compared to size (W/L) ratio of second PMOS transistor 423A may be, for example, N:1, where N>1.

The second transconductance stage 423 can include a current mirror. The current mirror is formed by connecting the gate of NMOS transistor 423B to the gate of NMOS transistor 423C, and shorting the drain on NMOS transistor 423B to the gate of NMOS transistor 423B. The current mirror acts to draw a current from the first transconductance stage 413 through the impedance Z that mirrors the current from PMOS transistor 423A to NMOS transistor 423C. The drain of NMOS transistor 423C is connected to the second terminal of the impedance 415. The current mirror can have a gain K, for example, if the current mirror gain K is 1, the current mirror gain is referred to as 1:1. The current mirror gain K is part of the transconductance of transconductance stage 423. If the transconductance of the device 423A is gm, then the transconductance of 423 is gm multiplied by the current mirror gain K. Programmability of the transconductance of 423 and thereby the negative output impedance can be achieved through programming of the current mirror gain K. Note that either transconductance stage 413 or 423, or both, can be tuned using switches and additional devices as shown or as described with respect to FIGS. 3A and 3B. The current mirror gain K is shown as 1:1 in the embodiments described in FIGS. 5 and 6, and the transconductance ratio between 413A and 423A was N for the above expressions. For example, in FIG. 4, if the current mirror gain is changed to K:1, N is replaced by N/K. For example, the output resistance of the negative impedance stage changes from $-Z/(N-1)$ to $-Z/[(N/K)-1]$, and the current values are affected as shown in FIG. 4.

Due to the sizing of the PMOS transistor 413A in the first transconductance stage 413, it passes a current in response to the input voltage $V_{IN}$ that is N times larger than the current output from PMOS transistor 423A in the second transconductance stage 423. In the exemplary circuit, the current output by the first transconductance stage 413 is approximately $[I_L(N/K)]/[(N/K)-1)]$.

The circuit 400 effectively negates the load impedance (not shown). Alternative embodiments are also possible. As shown in FIG. 4, the switches 440 can be optionally opened or closed to selectively program the current mirror gain K, which factors into the transconductance ratio of the first transconductance stage to the second transconductance stage. By adding transistors 423D and/or 423E, the current mirror ratio between the transistors 423C-423E and 423B can be varied by switching one or more of the transistors 423C-423E in or out of the circuit. An optional filter, such as RC filter 460 can be added to limit the bandwidth for stability. Optionally, bias current sources 450A, 450B can be added to maintain the desired bias current in the transconductance stages. The bias current sources can be positioned at either of the representative locations shown. The bias currents sources 450A, 450B can be resistors. The effect of the bias current sources 450A, 450B on the output voltage Vo can be offset by adjusting $V_{IN}$.

Figure 5:
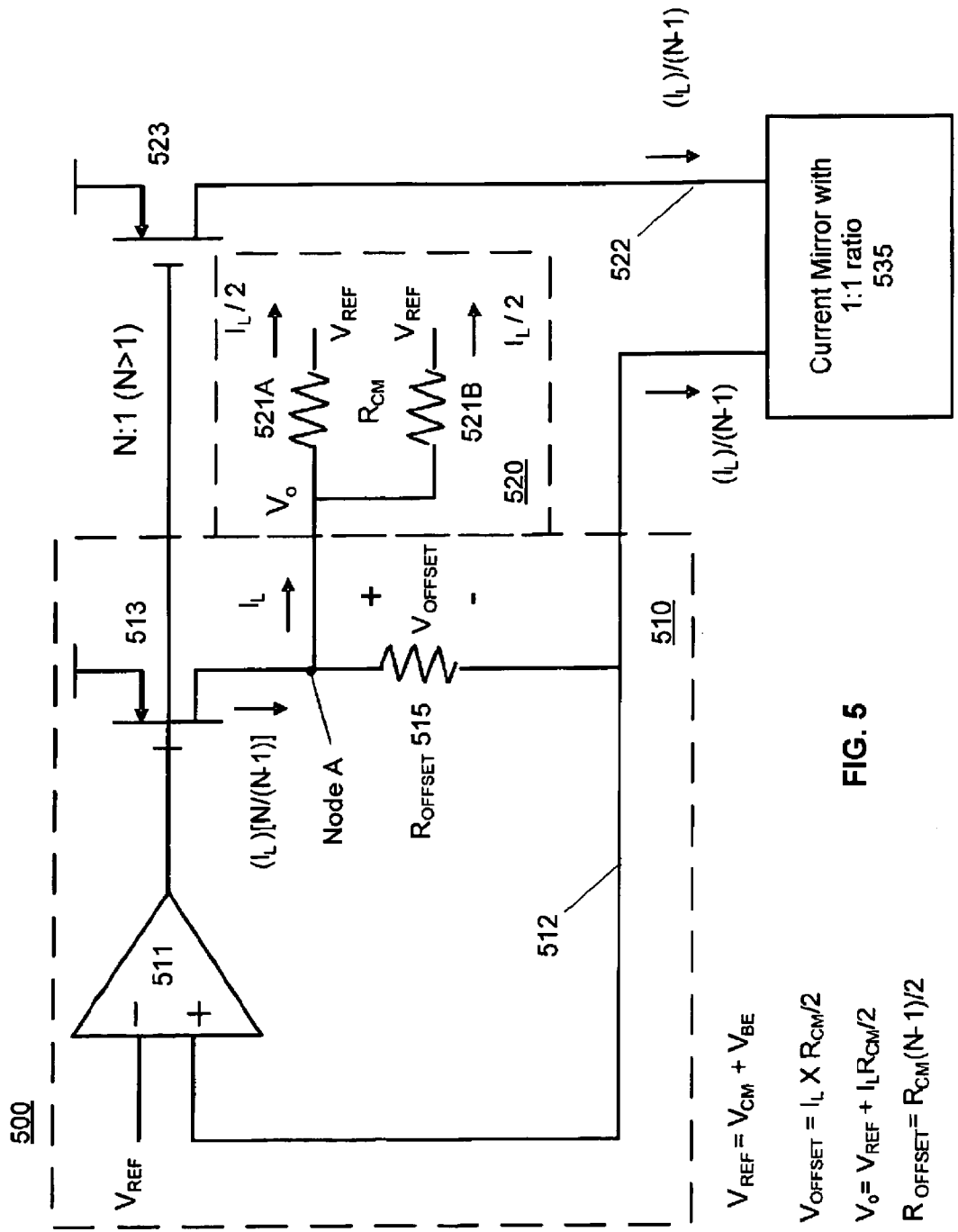
FIG. 5 illustrates a schematic diagram of an exemplary implementation of a circuit according to an exemplary embodiment of the present invention.

FIG. 5 illustrates a schematic diagram of an exemplary implementation of a circuit according to an embodiment of the present invention.

The circuit 500 comprises a voltage regulator 510 and a set of common-mode resistors 520. The voltage regulator 510 may include an voltage amplifier 511, a first PMOS transistor 513, and an offset resistor, $R_{OFFSET}$ 515. A purpose of the circuit 500 is to offset a component of the voltage Vo shown at Node A. The voltage Vo fluctuates according to the fluctuating voltage $I_L R_{CM}$ as explained above, where $I_L$ represents (and approximately equals) $2*I_{AVG}$ of FIG. 1.

Connected to voltage regulator 510 are a second PMOS transistor 523 and a current mirror 535. The second PMOS transistor 523 is paired with first PMOS transistor 513, both of which are connected at the gate to the output terminal of voltage amplifier 511. The size (W/L) ratio of first PMOS transistor 513 to second PMOS transistor 523, for example, may be N:1, with N>1.

The voltage amplifier 511 may be arranged in a feedback configuration. Input voltage $V_{REF}$ may be applied at the inverting input of voltage amplifier 511, where, preferably, $V_{REF}=V_{CM}+V_{BE}$ (in reference to FIG. 1). The voltage $V_{REF}$ may be a common-mode reference voltage available from any convenient source.

The gate of PMOS transistor 513 is connected to the output terminal of voltage amplifier 511. The source of PMOS transistor 513 may be connected to voltage $V_{DD}$, and the drain is connected to a terminal (+) of offset resistor $R_{OFFSET}$ 515. The opposite terminal (−) of offset resistor $R_{OFFSET}$ 515 is connected to the non-inverting terminal of voltage amplifier 511. Offset resistor $R_{OFFSET}$ 515 is preferably sized to be equal to $R_{CM}(N-1)/2$, where N is the size (W/L) ratio of PMOS transistor 513 with respect to PMOS transistor 523.

The feedback loop 512 to the non-inverting input of voltage amplifier 511 may include the gate-drain of PMOS transistor 513 and offset resistor $R_{OFFSET}$ 515.

The current mirror 535 has two connection points: one point connected to the drain of PMOS transistor 523; and the other point is connected between the (−) terminal of offset resistor $R_{OFFSET}$ 515.

The current mirror 535 may include a low pass filter that serves to bandwidth limit the feedback loop 522 to address complications of having a positive feedback loop to voltage amplifier 511 and provide stability.

The ratio of the current mirror 535 is shown as 1:1, but it can be any ratio, so long as other devices, e.g., resistors and transistors, in the circuit 500 are appropriately scaled to provide acceptable output impedance with respect to the current mirror ratio.

The common-mode circuit 520 may be connected between the drain of PMOS transistor 513 and offset resistor $R_{OFFSET}$ 515 at Node A. The common mode resistors $R_{CM}$ 521A and 521B are representative of resistor 130.1,130.2 of FIG. 1.

By offsetting the fluctuating component of the output of 520, the operation of common-mode 520 remains stable. The common-mode 520 output being equal to the common-mode voltage $V_{CM}+V_{BE}$ or $V_{REF}$.

Figure 6:
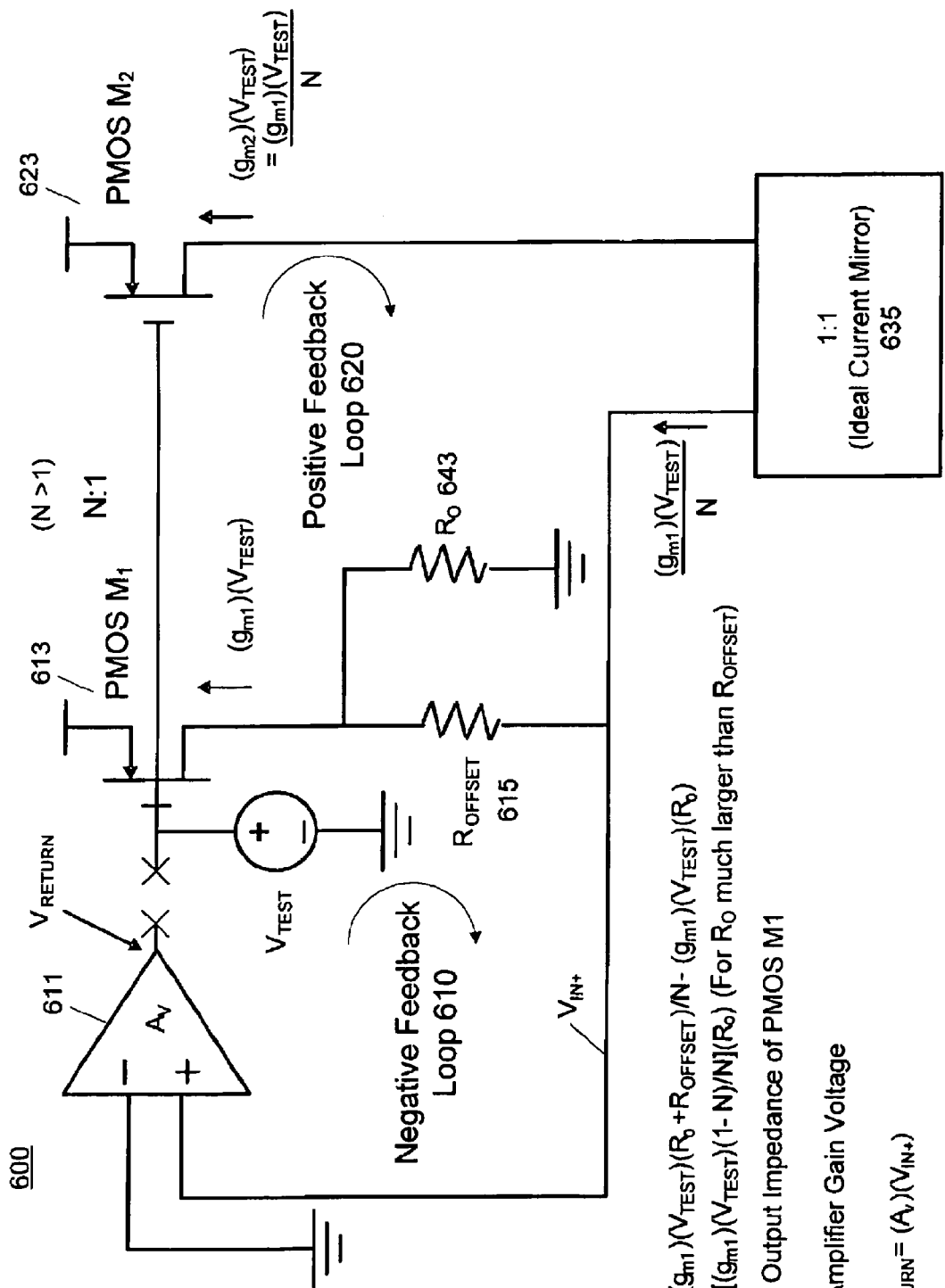
FIG. 6 is a simplified description of an amplifier that models operation of the embodiment of FIG. 5.

FIG. 6 is a simplified description of an amplifier that models operation of the embodiment of FIG. 5. The circuit 600 of FIG. 6 illustrates two feedback loops: a negative feedback loop 610 and a positive feedback loop 620. The voltage amplifier 611 has a gain voltage equal to $A_v$, and an output voltage equal to $V_{RETURN}$. The inverting input of the voltage amplifier 611 is shown connected to ground, while the non-inverting input is shown connected in the feedback path between offset resistor $R_{OFFSET}$ 615 and the current mirror 635. The output of the voltage amplifier 611 is shown as an open circuit. A test voltage source $V_{TEST}$ is shown connected to the gate of PMOS transistor $M_1$ 613.

The negative feedback loop may include the PMOS transistor $M_1$ 613, $R_{OFFSET}$ 615 and $R_O$ 643. The resistance $R_O$ 643 represents the output impedance of PMOS transistor $M_1$ 613, which if there is a load impedance, resistance $R_O$ 643 can be connected in parallel with the load impedance. The PMOS transistor $M_1$ 613 has a transconductance $g_{m1}$. The resistance $R_O$ 643 may be larger than resistance $R_{OFFSET}$ 615. The resistance $R_{OFFSET}$ 615 is connected to the non-inverting terminal of the voltage amplifier 611 to complete the negative feedback loop. An ideal current mirror 635 is also connected between $R_{OFFSET}$ 615 and the non-inverting terminal of the voltage amplifier 611.

The positive feedback loop 620 may include PMOS transistor $M_2$ 623, and current mirror 635. The PMOS transistor $M_2$ has a conductance $g_{m2}$. The ideal current mirror 635 is shown as a 1:1 current mirror. The PMOS transistor $M_1$ 613 can be N times larger that PMOS M2 623, where N may be greater than 1.

In theory, the voltage $V_{TEST}$ applied to the gates of PMOS transistor $M_1$ 613 and PMOS transistor $M_2$ 623 allows current to flow into each of the respective feedback loops. The current through PMOS transistor $M_2$ 623 into the positive feedback loop causes the current mirror 635 to output current equal to $[(g_{m1}) \times (V_{TEST})/N]$, which is equal to the current through PMOS transistor $M_2$ 623. Transistor $M_1$ 613 outputs a current through the negative feedback loop equal to $(g_{m1})(V_{TEST})$. The resulting voltage $V_{IN+}$ applied to the non-inverting input is equal to $(g_{m1})(V_{TEST})(R_o+R_{OFFSET})/N-[(g_{m1})(V_{TEST})(R_o)]$. In the case of $R_o$ being much larger than $R_{OFFSET}$, the voltage $V_{IN+}$ equals approximately $[(g_{m1})(V_{TEST})(1-N)/N](R_o)$.

The voltage $V_{RETURN}$ is equal to $(A_V)(V_{IN+})$. The DC value of the feedback gain is equal to $(V_{RETURN})/(V_{TEST})$, which is approximately equal to $(A_V)(g_{m1})(R_O)(1-N)/N$ for $R_o$ much larger than $R_{OFFSET}$. The DC value of the feedback gain will be a negative number because N is greater than 1.

Figure 7:
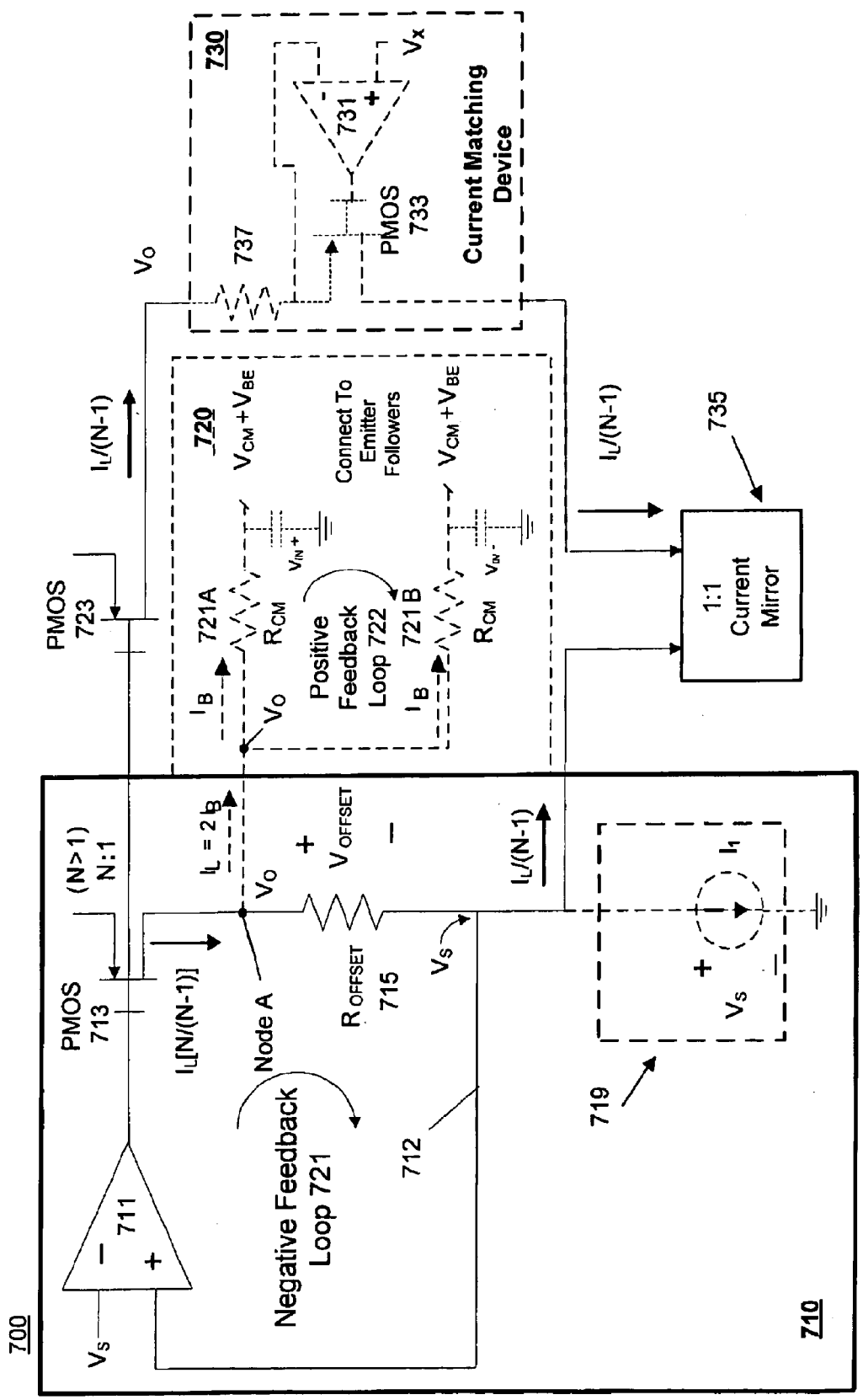
FIG. 7 illustrates a schematic diagram of an exemplary implementation of a circuit according to another exemplary embodiment of the present invention.

Another implementation according to an alternative exemplary embodiment will now be described with reference to FIG. 7. The circuit 700 may include a voltage regulator 710, a common mode 720, and an optional current matching device 730.

The voltage regulator 710 may include a voltage amplifier 711, a first PMOS transistor 713, and an offset resistor, $R_{OFFSET}$ 715. The purpose of the circuit 700 is to offset a component of the voltage Vo shown at Node A. The voltage Vo fluctuates according to the fluctuating voltage $I_L R_{CM}$ as explained above, where $I_L$ represents (and approximately equals) $2*I_{AVG}$ of FIG. 1.

Connected to voltage regulator 710 are a common-mode 720, a second PMOS transistor 723 and a current mirror 735. The second PMOS transistor 723 is paired with first PMOS transistor 713, both of which are connected at the gate to the output terminal of voltage amplifier 711. The first PMOS transistor 713 may have a W/L ratio with respect to second PMOS transistor 723 equal to N, where N is greater than 1, i.e., (N>1). The size ratio of first PMOS transistor 713 to second PMOS transistor 723, for example, may be N:1.

In an alternative embodiment, the current mirror 735 can be tunable. As described above with respect to FIG. 4, the current mirror 735 may be tunable by switching devices into and out of the current mirror 735 circuitry or other methods, such as those described with respect to FIG. 3A or 3B.

The voltage amplifier 711 may be arranged in a feedback configuration. Input voltage $V_S$ may be applied at the inverting input of voltage amplifier 711, where, $V_S = V_{CM} + V_{BE}$ (in reference to FIG. 1). The voltage $V_S$ may be a common-mode reference voltage available from any convenient voltage source.

The gate of PMOS transistor 713 is connected to the output terminal of voltage amplifier 711. The source of PMOS transistor 713 is connected to voltage $V_{DD}$, and the drain is connected to a terminal (+) of offset resistor $R_{OFFSET}$ 715. The opposite terminal (−) of offset resistor $R_{OFFSET}$ 715 is connected to the non-inverting terminal of voltage amplifier 711. Offset resistor $R_{OFFSET}$ 715 may be sized to be equal to $R_{CM}(N-1)/2$, where N is the size of PMOS 713 (W/L) with respect to 723.

The feedback loop 712 to the non-inverting input of voltage amplifier 711 may include the gate-drain of PMOS transistor 713 and offset resistor $R_{OFFSET}$ 715.

The current mirror 735 has two connection points: one point connected to the drain of PMOS transistor 723; and the other point may be connected between the (−) terminal of offset resistor $R_{OFFSET}$ 715.

The current mirror 735 may comprise a low pass filter that serves to bandwidth limit the feedback loop 722 to address complications of having a positive feedback loop to voltage amplifier 711 and provide stability.

The ratio of the current mirror 735 is shown as 1:1, but it can be any ratio, so long as other devices, e.g., resistors and capacitors, in the circuit 700 are appropriately scaled to provide acceptable output impedance with respect to the current mirror ratio.

The common-mode circuit component 720 may be connected between the drain of PMOS transistor 713 and offset resistor $R_{OFFSET}$ 715 at Node A. The common mode resistors $R_{CM}$ 721A and 721B are representative of resistor 130 of FIG. 1.

By offsetting the fluctuating component of Vo, the operation of common-mode 720 remains stable. The common-mode output being equal to the stable common-mode voltage $V_{CM} + V_{BE}$ or $V_S$.

In the voltage regulator 710, optional representative current source 719 is shown connected between the (−) terminal of offset resistor $R_{OFFSET}$ 715 and ground. The optional current source 719 can be included to provide a biasing current $I_1$ to the PMOS transistor 713. The biasing current $I_1$ can be set to a fixed value by the system designer for biasing and scaling purposes. Current source 719 can be a resistor.

An added level of error control can also be incorporated to insure that the proper current is provided through the PMOS transistor 723. The optional current matching device 730, in this exemplary embodiment, can include an input, an amplifier 731, a PMOS transistor 733, a resistor 737, and an output. The optional current matching device 730 can provide a current to the current mirror 735 that is properly scaled to the current through PMOS transistor 713 through $R_{OFFSET}$ 715.

The input to optional current matching device 730 may be connected to the drain of PMOS transistor 723 and resistor 737. A first terminal of resistor 737 may be connected to the input of error amplifier section 730 and a second terminal of resistor 737 may be connected to the source of PMOS 733 and the inverting input of amplifier 731. Resistor 737 can be equal to $R_{OFFSET}$ 715 in voltage regulator component 710.

PMOS transistor 733 has a source connected to the second terminal of resistor 737, a gate connected to the output of amplifier 731, and a drain connected to an output of the optional current matching device 730.

An input of optional current matching device 730 may be connected to voltage amplifier 731. A voltage Vx can be applied to the input and further applied to the non-inverting input of the voltage amplifier 731. The inverting input of the voltage amplifier 731 may be connected between resistor 737 and source of PMOS transistor 733. The output of voltage amplifier 731 may be connected to the gate of PMOS transistor 733. The drain of PMOS transistor 733 may be connected to an output of the current matching device 730, and may be connected to the current mirror 735.

The operation of FIG. 7 will now be described in more detail. The current $I_L[N/N-1]$ provided through PMOS transistor 713 generates the voltage $V_O$ at Node A. At Node A, $V_O$ approximately equals $V_{REF} + V_{OFFSET}$. The component of voltage $V_O$ that needs to be offset is the voltage approximately equal to $I_L R_{CM}/2$.

Due to the feedback configuration of voltage amplifier 711, PMOS transistor 713 turns off as the voltage at non-inverting terminal of the voltage amplifier 711 increases with respect to $V_{REF}$.

Current approximately equal to $(I_L)[(N/(N-1)]$ may be supplied through PMOS transistor 713. The additional current causes an offset voltage $V_{OFFSET}$ approximately equal to $I_L R_{CM}/2$ to drop over $R_{OFFSET}$. At Node A, the voltage Vo is approximately equal $I_L R_{CM}/2 + V_{BE} + V_{CM}$.

Voltage $V_O$ may be applied to the common mode 720, where the voltage is dropped over the common mode resistors $R_{CM}$ leaving an approximate voltage $V_{BE} + V_{CM}$ present at the base of the emitter followers as illustrated in FIG. 1.

The voltage $V_{BE}$ is dropped over the base emitter of the input buffer device and leaving a stable $V_{CM}$ at the end of sample phase.

As for the optional current matching device 730, the same circuit that supplies Vs as input to voltage amplifier 711 supplies the voltage $V_X$ to the inverting input of amplifier 711. The voltage $V_X \cong [(V_{CM} + V_{BE})]$.

Amplifier 731 regulates the voltage at the bottom of resistor 737 to be nearly equal to $V_X$. With resistor 737 matched to $R_{OFFSET}$, equal currents in each resistor (as set by current mirror 735), and the bottom terminals of $R_{OFFSET}$ 715 and resistor 737 set nearly equal to $V_S$, the drain voltages of PMOS devices 713 and 723 are nearly equal. This acts to maintain the current through PMOS transistor 723 at a level consistent with $(I_L)/(N-1)$. By controlling the current to a level consistent with $(I_L)/(N-1)$, the current "mirrored" in regulator section 710 is also maintained at substantially the same level, and the voltage at the drain of PMOS transistor 723 is maintained equal to that of PMOS transistor 713 (Vo).

Several features and aspects of the present invention have been illustrated and described in detail with reference to particular embodiments by way of example only, and not by way of limitation. Those of skill in the art will appreciate that alternative implementations and various modifications to the disclosed embodiments are within the scope and contemplation of the present disclosure. Therefore, it is intended that the invention be considered as limited only by the scope of the appended claims.

I claim:

1. An input common-mode reference buffer, comprising:
a voltage amplifier including an input for receiving a voltage reference and an output of which is connected to a gate of a first transistor and a gate of a second transistor,
a current mirror having connection points, one connection point connected to a drain of the first transistor and another connection point connected to a drain of the second transistor, wherein the first transistor is sized to have a larger transconductance than the second transistor,
an offset resistor connected between the drain of the first transistor and the respective connection point of the first transistor to the current mirror;
a first feedback path to the voltage amplifier comprising the first transistor and the offset resistor,
a second feedback path to the voltage amplifier comprising the second transistor and the current mirror; and
a connection point for outputting a stable reference voltage based on the voltage applied to the input.

2. The input reference buffer of claim 1, wherein the first and second feedback paths to the voltage amplifier connect to a first input of the voltage amplifier; and the voltage is applied to a second input of the voltage amplifier.

3. The input reference buffer of claim 1, wherein the first transistor is sized to have a greater transconductance than the second transistor.

4. The input reference buffer of claim 1, wherein the offset resistor has a value smaller than an output impedance of the first transistor.

5. The input reference buffer of claim 1, comprising:
a current matching device in the second feedback path connected between the drain of the second transistor and a connection point of the current mirror.

6. The input reference buffer of claim 5, wherein the current matching device comprises:
a resistance;
a third transistor; and
a voltage amplifier.

7. The input reference buffer of claim 1, wherein a common-mode reference circuit is connected to the connection point.

8. An input voltage buffer, comprising:
an input connected to a first input of a voltage amplifier;
a first feedback path including the voltage amplifier, a first transistor, and an offset resistor, wherein the first feedback path is traced from the output of the voltage amplifier through the first transistor through the offset resistor to a second input of the voltage amplifier;
a second feedback path including the voltage amplifier, a second transistor, and a current mirror, the second feedback path tracing a path from the output of the voltage amplifier through the second transistor to a connection point on the current mirror and from another connection point on the current mirror to a second input of the voltage amplifier; and
a buffer output connected at the drain of the first transistor in the first feedback path.

9. The input voltage buffer of claim 8, wherein a voltage is applied to the first input of the voltage amplifier.

10. The input voltage buffer of claim 8, wherein the first transistor is sized to have a larger transconductance than the second transistor.

11. The input voltage buffer of claim 8, wherein the offset resistor has a value smaller than an output impedance of the first transistor.

12. The input voltage buffer of claim 8, comprising:
a current matching device in the second feedback path connected between the drain of the second transistor and a connection point of the current mirror.

13. The input voltage buffer of claim 12, wherein the current matching device comprises:
a resistance;
a third transistor; and
a voltage amplifier.

14. The input buffer of claim 8, wherein a common-mode reference circuit is connected to the buffer input.

15. An amplifier circuit comprising:
a pair of differential signal paths, each having an input terminal for a respective input voltage and an output terminal for a respective output voltage, each signal path traversing at least one respective transistor across base to emitter terminals thereof;
an amplifier having an input for a common mode voltage and an output coupled to bases of each of the transistors via respective impedance devices,
wherein the amplifier provides an effective output impedance having a negative impedance value.

16. The amplifier circuit of claim 15, wherein each of the pair of differential signal paths connects to a base of a first transistor and a base of a second transistor respectively.

17. The amplifier circuit of claim 15, wherein the respective impedance devices comprise a first resistor connected between the output of the amplifier and the base of the first transistor and a second resistor connected between the output of the amplifier and the base of the first transistor.

18. The amplifier circuit of claim 15, wherein a voltage is sampled at the emitter of the at least one respective transistor.

* * * * *